United States Patent
Park

(10) Patent No.: US 11,200,941 B2
(45) Date of Patent: Dec. 14, 2021

(54) ELECTRONIC DEVICE INCLUDING MEMORY DEVICE AND TRAINING METHOD

(71) Applicant: SAMSUNG ELECTRONICS CO., LTD., Suwon-si (KR)

(72) Inventor: Kyumin Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/016,554

(22) Filed: Sep. 10, 2020

(65) Prior Publication Data
US 2021/0241815 A1 Aug. 5, 2021

(30) Foreign Application Priority Data
Feb. 4, 2020 (KR) .................. 10-2020-0012949

(51) Int. Cl.
*G11C 11/4076* (2006.01)
*G11C 11/4096* (2006.01)
*G11C 11/4074* (2006.01)

(52) U.S. Cl.
CPC ...... *G11C 11/4076* (2013.01); *G11C 11/4074* (2013.01); *G11C 11/4096* (2013.01)

(58) Field of Classification Search
CPC ............ G11C 11/4076; G11C 11/4096; G11C 11/4074
See application file for complete search history.

(56) References Cited

U.S. PATENT DOCUMENTS

| | | | |
|---|---|---|---|
| 7,036,053 B2 | 4/2006 | Zumkehr et al. | |
| 7,180,800 B2 | 2/2007 | Kim | |
| 7,567,880 B2 | 7/2009 | Iizuka | |
| 9,177,623 B2 | 11/2015 | Pandey et al. | |
| 9,971,975 B2 | 5/2018 | Rao et al. | |
| 10,325,633 B2 | 6/2019 | Lee et al. | |
| 2005/0135167 A1* | 6/2005 | Manabe | G11C 29/12015 365/201 |
| 2018/0018583 A1* | 1/2018 | Cha | G06F 3/0685 |

* cited by examiner

*Primary Examiner* — Jay W. Radke
(74) *Attorney, Agent, or Firm* — Volentine, Whitt & Francos, PLLC

(57) ABSTRACT

An electronic device includes a memory device receiving a power supply voltage, a data strobe signal, and a data signal, and a system-on-chip that exchanges data with the memory device using the data strobe signal and the data signal. The system-on-chip performs write training that measures a magnitude of a delay of the data strobe signal due to variation in the level of the power supply voltage and adjusts a delay of the data signal using a result of the write training.

20 Claims, 11 Drawing Sheets

ELECTRONIC DEVICE INCLUDING MEMORY DEVICE AND TRAINING METHOD

CROSS-REFERENCE TO RELATED APPLICATIONS

This application claims priority under 35 U.S.C. § 119 to Korean Patent Application No. 10-2020-0012949 filed on Feb. 4, 2020 in the Korean Intellectual Property Office, the subject matter of which is hereby incorporated by reference.

BACKGROUND

Embodiments of the inventive concept relate generally to semiconductor devices. More particularly, embodiments of the inventive concept relate to electronic devices capable of performing software training of a memory device and related training methods.

The use of mobile devices such as smartphones, tablet personal computers, digital cameras, MP3 players, personal digital assistants, and wearable technology is rapidly increasing. An application processor may be used as a core driving processor in many mobile devices. Volatile memory devices such as dynamic random access memory (DRAM) may be used as a main memory and/or a working memory in conjunction with an application processor including various intellectual properties IPs. The demand for high-performance, high-capacity memories running at faster operating frequencies and providing expanded data storage capacity as a working memory is also increasing.

Increases in operating speed often makes it difficult to secure acceptable data integrity for data exchanged between an application processor and a working memory (e.g., DRAM). In particular, in the case of a high-speed memory device, even though high-speed memory devices belong to the same product category, a synchronization parameter associated with a data signal DQ and/or a data strobe signal DQS may not be uniform. In addition, delay of the data strobe signal DQS may vary depending on the state of a power supply voltage supplied to the memory device, thereby further challenging efforts to secure data integrity.

SUMMARY

Embodiments of the inventive concept provide an electronic device, a computing system, and/or a training method capable of compensating for delay of a data strobe signal DQS due to the fluctuations in a power supply voltage by training a memory device.

According to embodiments of the inventive concept, an electronic device includes a system-on-chip (SoC) that generates a data strobe signal and a data signal, and a memory device that receives a power supply voltage and exchanges data with the SoC in response to the data strobe signal and the data signal, wherein the SoC performs write training that measures a magnitude of a delay of the data strobe signal due to variation in a level of the power supply voltage, and that adjusts a delay of the data signal using a result of the write training.

According to embodiments of the inventive concept, a training method for an electronic device including a system-on-chip (SoC) and a memory device includes; providing a data signal and a data strobe signal from the SoC to the memory device, setting a level of a power supply voltage provided to the memory device to a normal level to generate a normal power supply voltage, performing a first training mode to align the data signal with the data strobe signal under a condition that the normal power supply voltage is applied to the memory device, setting the level of the power supply voltage to a dropped level lower than the normal level to generate a dropped power supply voltage, performing a second training mode to align the data signal and the data strobe signal under a condition that the dropped power supply voltage is applied to the memory device, and calculating a delay for the data strobe signal due to variation in the level of the power supply voltage using a result of the first training mode and a result of the second training mode.

According to embodiments of the inventive concept, an electronic device includes; a memory device driven in response to a power supply voltage, a host configured to transfer a data signal and a data strobe signal to the memory device, and a power management integrated circuit (PMIC) configured to provide the power supply voltage to the memory device under control of the host, wherein the host performs software training that measures a delay of the data strobe signal due to variation in the level of the power supply voltage within the memory device.

According to embodiments of the inventive concept, an electronic system includes; a system-on-chip (SoC) including a training module and configured to generate a data strobe signal and a data signal, a power management integrated circuit (PMIC) that generates a second power supply voltage VDD2 under control of the SoC, and a Dynamic Random Access Memory (DRAM) configured to operate in accordance with a low power double data rate (LPDDR) standard, receive the second power supply voltage from the PMIC, and exchange data with the SoC in response to the data strobe signal and the data signal, wherein the SoC is further configured to execute code stored in the training module to perform write training of the DRAM by measuring a magnitude of a delay of the data strobe signal due to variation in a level of the second power supply voltage, and adjusting a delay of the data signal in response to a result of the write training.

BRIEF DESCRIPTION OF THE DRAWINGS

The above and other objects and features of the inventive concept will become more apparent upon consideration of the following detail description taken together with the accompanying drawings, in which.

DETAILED DESCRIPTION

It should be understood that both the foregoing general description and the following detailed description are provided as examples teaching the making and use of the invention recited in the claims that follow. Throughout the written description and drawings, like reference numbers and labels are used to denote like or similar elements and/or features associated with certain embodiments of the inventive concept.

The illustrated embodiments of the inventive concept described hereafter assume the use of a DRAM as a working memory. However, those skilled in the art will recognize that the scope of the inventive concept is not limited thereto. For example, other embodiments of the inventive concept may use a phase-change random access memory (RAM) (PRAM), a magneto-resistive RAM (MRAM), a resistive RAM (ReRAM), a ferroelectric RAM (FRAM), a NOR flash memory, etc. as a working memory. In this context, the working memory may be a memory (e.g.) used to store instruction(s) and/or data that control and/or are processed by a constituent electronic device. As used in the specification, the term "training" denotes an operation capable of searching for a latency or a signal level of a memory channel providing optimum (e.g., best available) reliability.

It should be further understood that the inventive concept may be implemented or applied through embodiments beyond those illustrated and/or described herein. In various aspects, the detailed description may be changed or modified depending on implementation and/or application details without departing from the scope of the following claims. Certain embodiments of the inventive concept will now be described in some additional detail with reference to the accompanying drawings.

Figure 1:
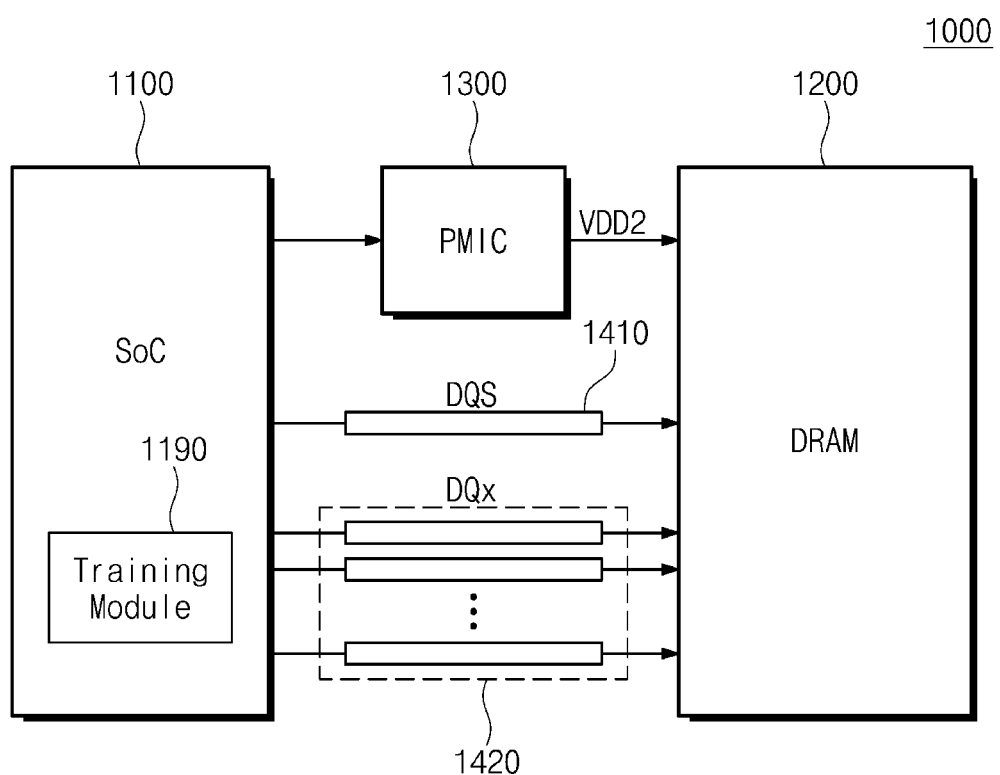
FIG. 1 is a block diagram illustrating an electronic device according to embodiments of the inventive concept.

FIG. 1 is a block diagram illustrating an electronic device according to embodiments of the inventive concept. Referring to FIG. 1, an electronic device 1000 may generally include a system-on-chip (SoC) 1100, a DRAM 1200, and a power management integrated circuit (PMIC) 1300. A data strobe line 1410 and one or more data lines 1420 may be used to exchange data between the SoC 1100 and the DRAM 1200.

The SoC 1100 may be used to control the execution of various applications and/or operations in response to requests received from a host device and/or a user. To execute an application, the SoC 1100 may load instructions and/or data associated with the application to the DRAM 1200. The SoC 1100 may also be used to drive an operating system OS capable of defining and/or executing various instructions, applications and/or functions associated with the execution of the application. To this end, the SoC 1100 may "write" data to the DRAM 1200 and/or may "read" data stored in the DRAM 1200.

The SoC 1100 may include a DRAM controller (see, e.g., FIG. 2) capable of controlling the overall operation of the DRAM 1200. For example, the DRAM controller may provide the DRAM 1200 with control signal(s), command (s), address(es) and/or data signal(s) DQ. Here, the control signal(s) provided by the DRAM controller may include a data strobe signal DQS.

The SoC 1100 may also include a training module 1190 capable of aligning one or more of the data signal(s) DQ with the data strobe signal DQS. In this regard, the training module 1190 may perform data training (or "DQ training") in relation to the DRAM 1200 during (or in response to) certain specific situations of the electronic device 1000, such as power-up, system booting and/or initialization. Here, operation of the training module 1190 (e.g., execution of "DQ training") may improve the reliability of data exchange between the SoC 110 and the DRAM 1200. For example, the training module 1190 may write a training pattern to, and/or read a training pattern from the DRAM 1200 under conditions that allow detection of the center of an eye pattern for the data signal DQ. In order to align the detected center of the data signal DQ, the training module 1190 may adjust an offset value for a delay locked loop DLL.

That is, during a write training operation, the training module 1190 may perform "write training" that compensates for a delay in the data strobe signal DQS which may occur in response to variation in the level of a power supply voltage VDD2. To this end, during write training, the training module 1190 may control the PMIC 1300 that provides the power supply voltage VDD2 to the DRAM 1200. During write training, the training module 1190 may detect a delay in the data strobe signal DQS which may occur when the level of a power supply voltage VDD2 falls below a normal (e.g., specified) level. In this manner, the training module 1190 may adjust a setup margin of the data signal DQ in order to compensate for the detected delay in the data strobe signal DQS.

The DRAM 1200 may be serve as a main memory for the electronic device 1000. Accordingly, the operating system OS and/or application programs may be loaded to the DRAM 1200 during a booting operation for the electronic device 1000. For example, when the SoC 1100 is booted up, a stored OS image may be loaded to the DRAM 1200 during a prescribed booting sequence. The overall input/output (I/O) operations of the SoC 1100 may be supported by the operating system OS. Likewise, one or more application programs (e.g., an application selected by a user) or an application associated with a basic service may be loaded to the DRAM 1200 during boot up.

Alternately or additionally, the DRAM 1200 may be used as a buffer memory that stores image data provided by an image sensor, such as a camera.

In certain embodiments, the DRAM 1200 may support byte access. Alternately, the DRAM 1200 may be replaced with a nonvolatile memory device supporting an overwrite function (e.g., a nonvolatile RAM, such as a PRAM, an MRAM, a ReRAM, a FRAM, or a NOR flash memory). During operation of the electronic device 1000, the operating system OS, an application program, and/or related data may be updated in the DRAM 1200. The DRAM 1200 may be provided as a multi-chip package or a module including multiple, stacked chips.

The DRAM 1200 receives at least one, externally provided, power supply voltage. Assuming an illustrative case wherein the DRAM 1200 operates in compliance with a low-power, double data rate (LPDDR) standard, the DRAM 1200 may receive power supply voltages VDD1, VDD2, and VDDQ from the PMIC 1300. In this regard, various power supply voltages (e.g., those commonly associated with operation of a cell core and/or operation of one or more peripheral circuit(s)) may be provided to the DRAM 1200. Thus, a first power supply voltage VDD1 may be used to drive the cell core, a second power supply voltage VDD2 may be used to power at least one peripheral circuit, and a third power supply voltage VDDQ may be used to power an I/O circuit in the DRAM 1200.

Under control of the SoC 1100, the PMIC 1300 may be used to generate power supply voltage(s) and provide the power supply voltage(s) to the DRAM 1200. The PMIC 1300 may be variously implemented. For example the PMIC 1300 may include a DC-DC converter or a voltage regulator.

In certain embodiments, the PMIC 1300 may be used to vary an output level of the second power supply voltage VDD2 during write training. For example, the PMIC 1300 may generate the second power supply voltage VDD2 with a 1.1 V level during a first training mode, and with a 1.05 V level during a second training mode.

The data strobe line 1410 and the data line(s) 1420 provide transmission paths of data or signals between the SoC 1100 and the DRAM 1200.

So, according to one possible configuration for the electronic device 1000, the SoC 1100 may vary the level of the second power supply voltage VDD2 during write training for the DRAM 1200. The SoC 1100 may measure the delay in the data strobe signal DQS which occurs as the level of the second power supply voltage VDD2 is varied (e.g., decreases). The SoC 1100 may also adjust a setup margin for the data signal DQ in order to compensate for the measured delay in the data strobe signal DQS. As a result, high-speed data reliability issues associated with variation in the second power supply voltage VDD2 may be minimized in the DRAM 1200 through the use of write training.

Figure 2:
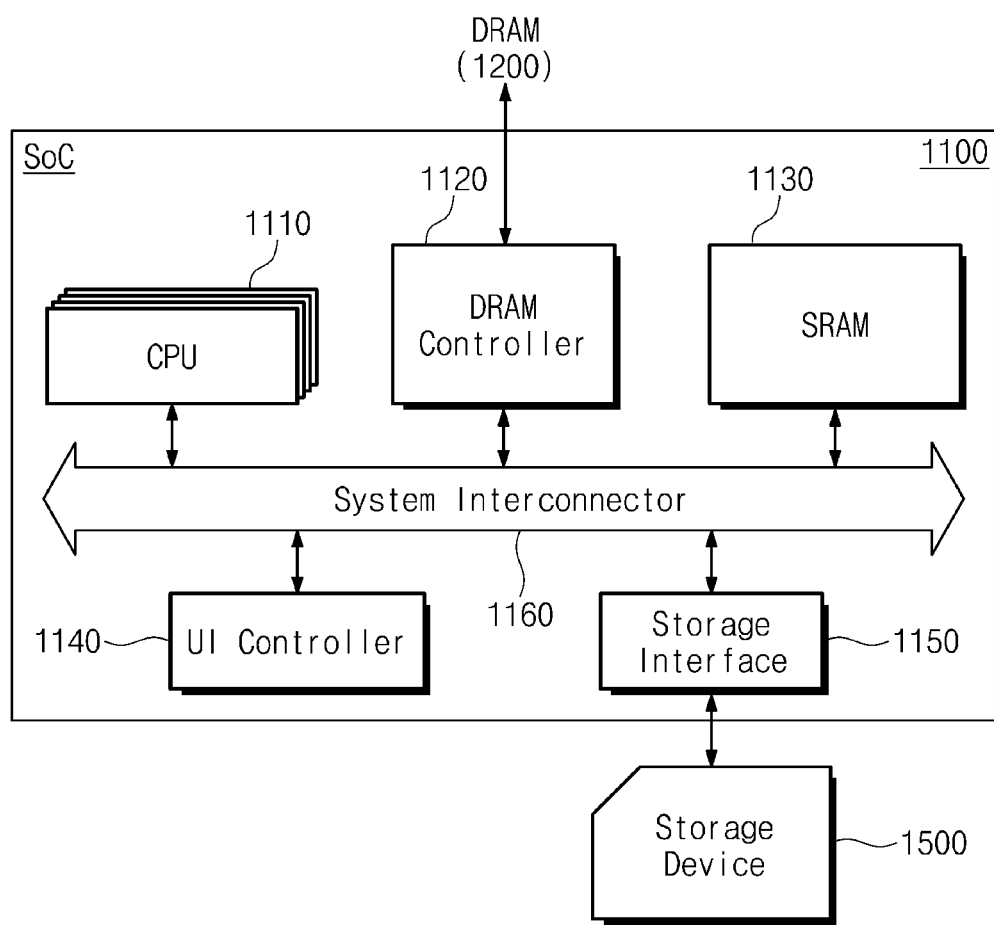
FIG. 2 is a block diagram further illustrating in one example the system-on-chip 1100 of FIG. 1.

FIG. 2 is a block diagram further illustrating in one example the SoC 1100 of FIG. 1. Referring to FIG. 2, the SoC 1100 is shown connected to the DRAM 1200 and a storage device 1500. Although not illustrated in FIG. 2, the SoC 1100 may also be connected to a display device (e.g., a liquid crystal display or touch panel).

The SoC 1100 illustrated in FIG. 2 may include a central processing unit (CPU) 1110, a DRAM controller 1120, an SRAM 1130, a user interface (UI) controller 1140, a storage interface 1150, and a system interconnector 1160. However, the SoC 1100 may be variously configured and may include other components (e.g., a hardware CODEC for processing image data, a security block, etc.).

The CPU 1110 executes software (e.g., an application program, an operating system, and/or device drivers). That is, the CPU 1110 may execute an operating system OS loaded to the DRAM 1200 and/or various application programs. In this regard, the CPU 1110 may fetch and execute training code loaded to the SRAM 1130 and/or the DRAM 1200. The CPU 1110 may control the DRAM controller 1120 such that the training operation for the DRAM 1200 (e.g., as requested by execution of the training code) may be performed. The CPU 1110 may be a homogeneous multi-core processor or a heterogeneous multi-core processor.

The DRAM controller 1120 may serve as an interface between the DRAM 1200 and the SoC 1100. That is, the DRAM controller 1120 may access the DRAM 1200 in response to request(s) received from the CPU 1110 or another SoC IP. For example, the DRAM controller 1120 may write data to the DRAM 1200 in response to a write request received from the CPU 1110. Alternatively, the DRAM controller 1120 may read data from the DRAM 1200 and may transfer the resulting read data to the CPU 1110 or the storage interface 1150.

The SRAM 1130 may serve as a working memory for the CPU 1110. A boot loader (e.g., training code used to execute boot up) and/or training code (code defining one or more training operation(s)) may be loaded to the SRAM 1130. Where the SoC includes the training module 1190 provided in code, the training module 1190 may be loaded to the SRAM 1130.

The UI controller 1140 may be used to control (e.g., decode data received from) certain I/O device(s), such as a keyboard, a mouse and/or a display. For example, the UI controller 1140 may control the display of a display in response to data input via a keyboard under control of the CPU 1110. Alternately, the UI controller 1140 may control the presentation of user-requested data on the display.

The storage interface 1150 may be used to control the storage device 1500 in response to request(s) received from the CPU 1110. That is, the storage interface 1150 serves as an interface between the SoC 1100 and the storage device 1500. For example, data processed by the CPU 1110 may be stored in the storage device 1500 through the storage interface 1150, and data stored in the storage device 1500 may be provided to the CPU 1110 through the storage interface 1150. Parameters determined by training operation(s) consistent with embodiments of the inventive concept may be stored in the storage device 1500 through the storage interface 1150.

The system interconnector 1160 is a system bus capable of providing an on-chip network within the SoC 1100. The system interconnector 1160 may include, for example, a data bus, an address bus, and/or a control bus. The data bus is a path through which data may be transferred. The data bus may serve as a memory access path through which the DRAM 1200 and/or the storage device 1500 access data. The address bus may provide an address exchange path between various IPs. The control bus may provide a path through which control signals are transferred between IPs. However, the configuration of the system interconnector 1160 is not limited to the above description, and the system interconnector 1160 may further include arbitration devices for efficient data and/or signals management.

The storage device 1500 may be used as a storage medium for the SoC 1100. That is, the storage device 1500 may be used to store application program(s), OS image(s), as well as various kinds of related data. In this regard, training code used to define a training operation for the DRAM 1200 may be stored in the storage device 1500. Alternately or additionally, training code may be stored in another nonvolatile memory.

The storage device 1500 may also be used to store various operating parameter(s) obtained as the result of one or more training operations for the DRAM 1200. Thus, information regarding various delay(s) in the data strobe signal DQS resulting from various drop(s) in the level of the second power supply voltage VDD2—obtained by execution of one or more training operations in relation to the DRAM 1200—may be stored in the storage device 1500. The storage device 1500 may be implemented with a memory card (e.g., MMC, eMMC, SD, and microSD). The storage device 1500 may include a high-capacity NAND-type flash memory. Alternatively, the storage device 1500 may include a next-generation nonvolatile memory, such as a PRAM, an MRAM, a ReRAM, or a FRAM, or a NOR flash memory. As other embodiments of the inventive concept, the storage device 1500 may be an embedded memory provided within the SoC 1100.

Consistent with the foregoing description, the SoC 1100 may be used to adjust the level of the second power supply voltage VDD2 during a training operation for the DRAM 1200. Further, the SoC 1100 may be used to compensate for a delay in the data strobe signal DQS occurring as the result of variation in the second power supply voltage VDD2. In this manner, data integrity may be improved.

Figure 3:
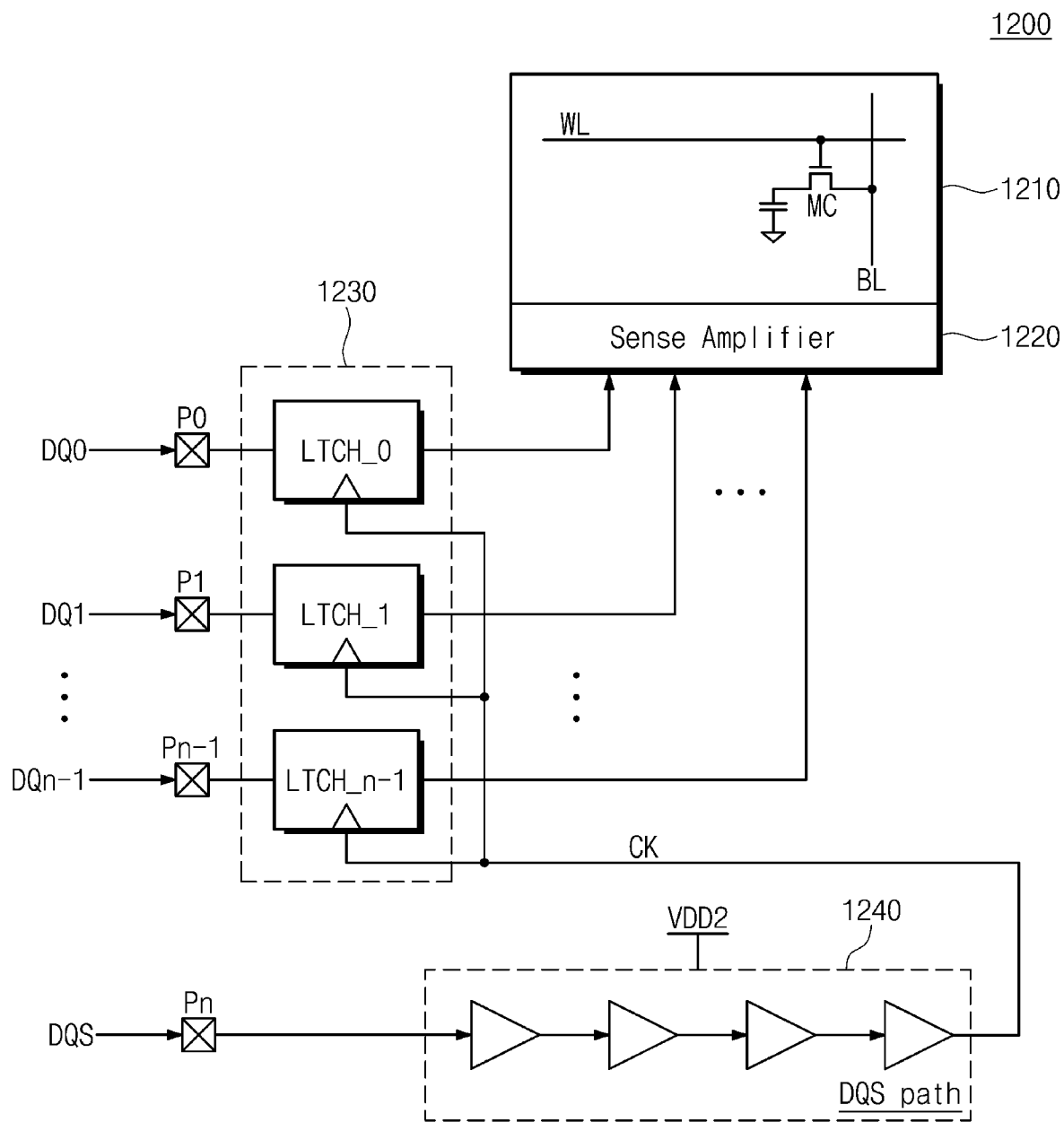
FIG. 3 is a block diagram partially illustrating in one example a configuration for the DRAM 1200 of FIG. 1.

FIG. 3 is a block diagram partially illustrating in one example a configuration for the DRAM 1200 of FIGS. 1 and 2. Referring to FIGS. 1, 2 and 3, the DRAM 1200 may include a cell array 1210, a sense amplifier 1220, a data latch 1230, and a clock path 1240. However, the DRAM 1200 may include additional components such as a row decoder, a column decoder, a refresh circuit, a command decoder, a mode register, etc.

The cell array 1210 includes memory cells MC connected with word lines WL and bit lines BL, and arranged in a row direction and a column direction. Each of the memory cells MC may include a cell capacitor and an access transistor. In each memory cell MC, a gate of the access transistor is connected with one of the word lines WL extending in the row direction. A first end of the access transistor is connected with a bit line BL or a complementary bit line BLB extending in the column direction. A second end of the access transistor is connected with the cell capacitor. The cell array 1210 may correspond to a memory core and may be driven by using the first power supply voltage VDD1.

The sense amplifier 1220 may be used to write data to a selected memory cell through a selected bit line, or may be used to sense previously written data through the selected bit line. The sense amplifier 1220 may sense and output data stored in a memory cell through a bit line. Also, the sense amplifier 1220 may include additional components for storing input data in a selected memory cell. The sense amplifier 1220 may rewrite data stored in a memory cell during a refresh operation. The sense amplifier 1220 may perform a refresh operation on selected memory cells under control of refresh control logic (not illustrated) of the inventive concept.

The data latch 1230 may include latches LTCH_0 to LTCH_n−1 that respectively "latch" data signals DQ0 to DQn−1 input during write training. Here, the latches LTCH_0 to LTCH_n−1 latch the data signals DQ0 to DQn−1 input through data pads P0 to Pn−1 synchronously with a clock signal CK provided by the clock path 1240. Data captured by the latches LTCH_0 to LTCH_n−1 may be provided to the sense amplifier 1220, so as to be written in the cell array 1210. Accordingly, the reliability of the DRAM 1200 may be determined in accordance with the write training of the DRAM 1200 that properly aligns the timing of the clock signal CK with the arrival of the data signals DQ0 to DQn−1 at the latches LTCH_0 to LTCH_n−1.

The clock path 1240 may be used to generate the clock signal CK in response to the data strobe signal DQS. Thus, the clock signal CK latches the data signals DQ0 to DQn−1 transferred to the latches LTCH_0 to LTCH_n−1 through the clock path 1240. The data strobe signal DQS provided to the DRAM 1200 may be input to the clock path 1240 through a pad Pn. The clock path 1240 may be provided as a peripheral circuit in the DRAM 1200. Accordingly, the clock path 1240 may include elements or circuits using the second power supply voltage VDD2.

Here, it should be recognized that the clock signal CK is correlated to variation in the level of the second power supply voltage VDD2. A delay of the clock signal CK may vary depending on a level change of the second power supply voltage VDD2. This means that the "latch time" (i.e., the moment at which data signals DQ0 to DQn−1 are latched) is variable. In a training operation according to embodiments of the inventive concept, the delay of the data strobe signal DQS occurring on the clock path 1240 may be measured by dropping the level of the second power supply voltage VDD2. The integrity of data may be improved by adjusting the setup margin of the data signals DQ0 to DQn−1 in view of the measured delay of the data strobe signal DQS.

In certain embodiments, the DRAM 1200 may measure a delay of the data strobe signal DQS due to variation in the level of the second power supply voltage VDD2 during write training. The setup margin for each of the data signals DQ0 to DQn−1 may be adjusted by using the measured delay of the data strobe signal DQS. Accordingly, it is possible to compensate for delay of the data strobe signal DQS due to variation in the level of the second power supply voltage VDD2 occurring in the DRAM 1200.

Figure 4:
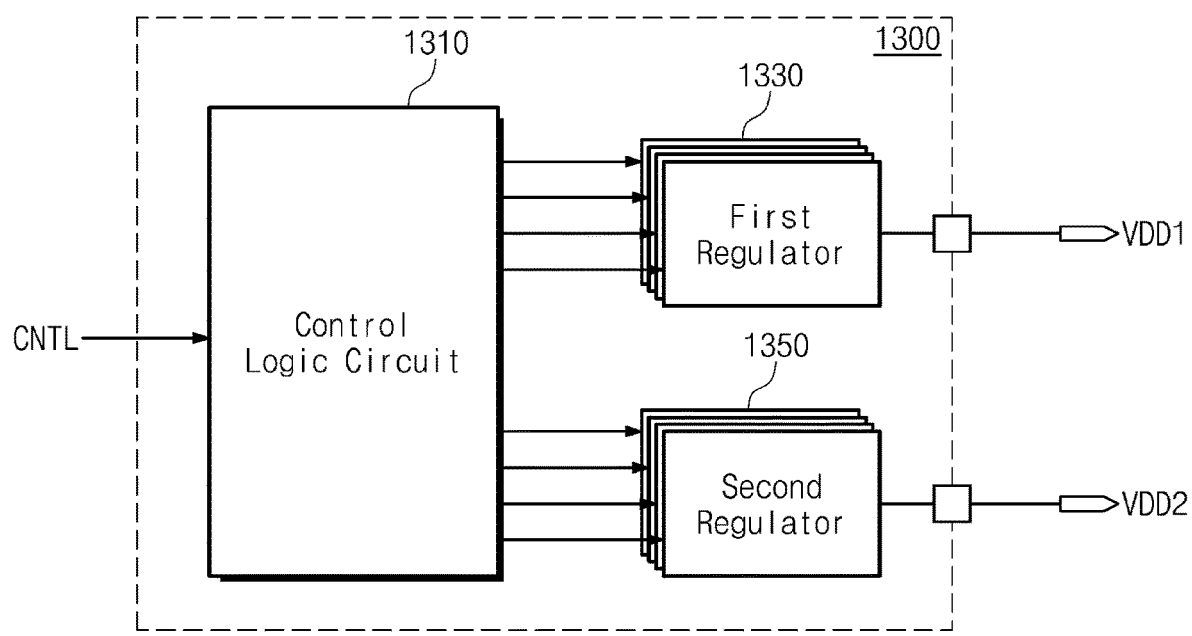
FIG. 4 is a block diagram illustrating in one example the power management integrated circuit (PMIC) 1300 of FIG. 1.

FIG. 4 is a block diagram further illustrating in one example the power management integrated circuit (PMIC) 1300 of FIG. 1. Referring to FIG. 4, the PMIC 1300 may include a control logic circuit 1310 and regulators 1330 and 1350.

The control logic circuit 1310 may be used to control the regulators 1330 and 1350 under the control of the SoC 1100 during a training operation. In particular, in a first training mode WT1, the control logic circuit 1310 may allow the first regulator 1330 to generate the first power supply voltage VDD1 and the second regulator 1350 to generate a "normal second power supply voltage" (e.g., a version of the second power supply voltage having its nominal, specified (or normal) level (e.g., VDD2). In a second training mode WT2, the control logic circuit 1310 may allow the second regulator 1350 to generate a "dropped second power supply voltage" (e.g., a version of the second power supply voltage having a level that is less than the normal level by a specified (or fixed) voltage drop (e.g., VDD2−ΔVd).

The level of the first power supply voltage VDD1 generated by the first regulator 1330 during the second training mode WT2 may be equal to the normal level of the first power supply voltage VDD1 that the first regulator 1330 generates during the first training mode WT1.

The first regulator 1330 generates the first power supply voltage VDD1 that is used in the memory core of the DRAM 1200. That is, the first regular 1330 may generate the first power supply voltage VDD1 having a normal voltage level for driving the cell array 1210 of FIG. 3. In certain embodiments, the first regulator 1330 may include at least one switching regulator, wherein the switching regulator may be provided in the form of a boost converter, a buck-boost converter, a buck converter, or a combination thereof.

The second regulator 1350 generates the second power supply voltage VDD2 that is used in the peripheral circuit(s) of the DRAM 1200. The second regulator 1350 may include at least one low drop-out (LDO) regulator. The LDO regulator may be provided in the form of a linear regulator capable of controlling a magnitude of the voltage drop in response to a level of an output voltage. However, the respective configurations of the first regulator 1330 and the second regulator 1350 are not limited to the above examples. For example, the first regulator 1330 or the second regulator 1350 may be implemented in a switching scheme or any schemes of LDO schemes or in a combination thereof.

In the first training mode WT1, the second regulator 1350 generates in the normal second power supply voltage VDD2. In contrast, in the second training mode WT2, the second regulator 1350 generates the dropped second power supply voltage VDD2−ΔVd under the control of the control logic circuit 1310.

Hence, the PMIC 1300 according to embodiments of the inventive concept may support the second training mode WT2 used to compensate for a delay of the data strobe signal DQS due to variation in the level of the second power supply voltage VDD2. That is, in the second training mode WT2, the PMIC 1300 may generate the dropped second power supply voltage under control of the SoC 1100 and may provide the dropped second power supply voltage VDD2 to the DRAM 1200.

Figure 5A:
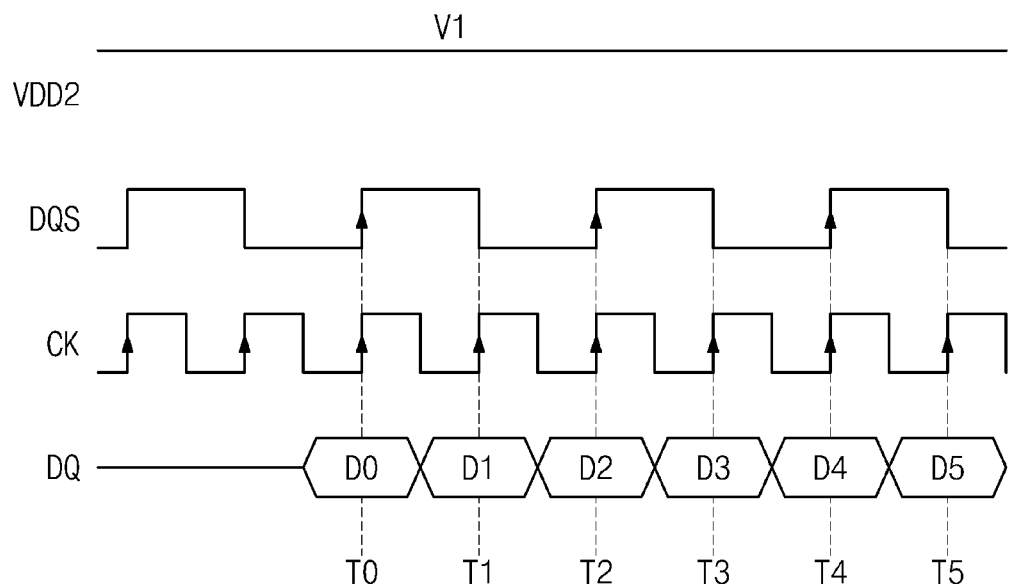
FIGS. 5A and 5B are timing diagrams illustrating certain signal timing relationships between a second power supply voltage and a data strobe signal in the DRAM of FIGS. 1 and 3.
Figure 5B:
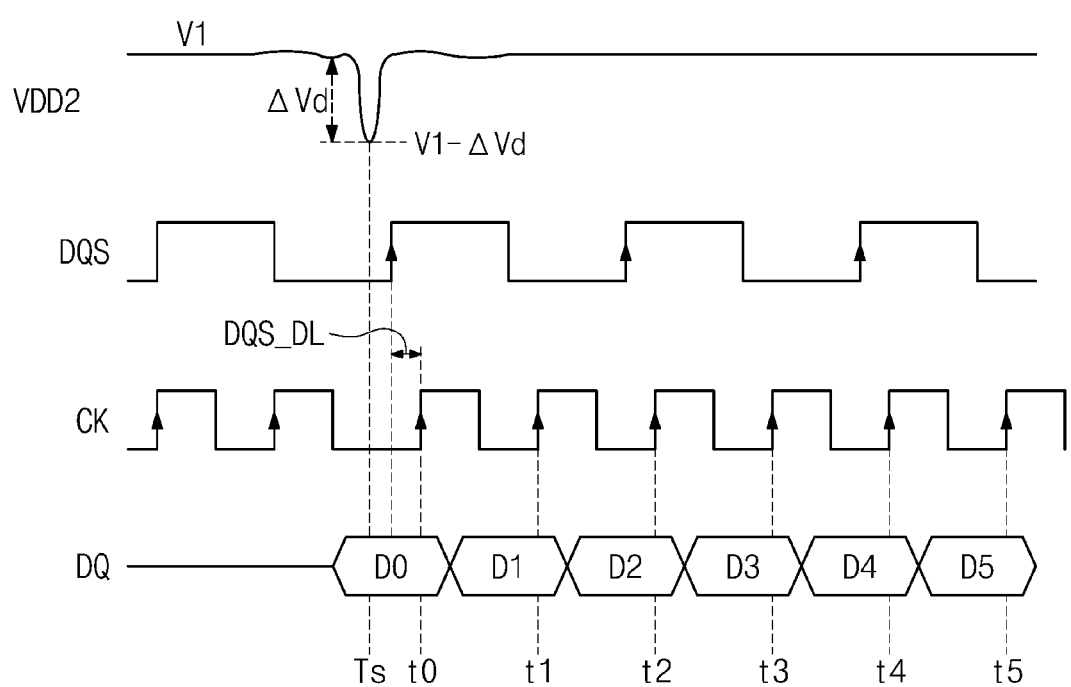

FIGS. 5A and 5B are timing diagrams illustrating certain timing relationships associated with variation in the level of the second power supply voltage VDD2 and a delay of the data strobe signal DQS in the DRAM 1200 of FIGS. 1, 2, 3 and 4.

A relationship between the data strobe signal DQS and the data signal DQ when the normal second power supply voltage VDD2 (e.g., voltage V1) is provided to the DRAM 1200 is shown in FIG. 5A. For example, when the level of the normal second power supply voltage VDD2 is maintained at (e.g.) 1.1 V, the operation of the clock path 1240 through which the data strobe signal DQS of the DRAM 1200 is transferred may be stably maintained. Accordingly, the clock signal CK for latching the data signal DQ maintains a stable timing.

The data strobe signal DQS and the data signal(s) DQ may be input to the DRAM 1200 under the condition that the level of the second power supply voltage VDD2 is maintained at a stable level of V1. The data strobe signal DQS may pass through the clock path 1240 such that the clock signal CK to be provided to the data latch 1230 is generated. In the case where the second power supply voltage VDD2 maintains the stable level V1, a delay on the clock path 1240 will not be material. Accordingly, the frequency of the clock signal CK may readily be defined (e.g.) as an integer multiple of the frequency of the data strobe signal DQS.

At a time T0, the clock signal CK generated from the data strobe signal DQS has a rising edge. At the rising edge of the clock signal CK, data D0 of the data signal DQ are latched by the data latch 1230. The data signal DQ may be latched by the data latch 1230 at rising edges of the clock signal CLK at a time T1 to a time T6 in the same manner. The rising edge of the clock signal CK may be aligned with the center of each of data D0 to D5.

A relationship between the data strobe signal DQS and the data signal DQ when a level of the second power supply voltage VDD2 varies (e.g.) due to noise or some other factor is illustrated in FIG. 5B. Here, a case where the level of the second power supply voltage VDD2 drops by ΔVd from the normal level V1 is illustrated. As the level of the second power supply voltage VDD2 varies, the delay of the clock path 1240 may increase. Accordingly, even though the data strobe signal DQS is normally applied to the DRAM 1200, the delay DQS_DL may occur in the clock signal CK. Here, the specific voltage drop 'ΔVd' for the second power supply voltage VDD2 may be determined with reference to the operating specifications of the DRAM 1200. For example, assuming a DRAM 1200 configuration compatible with a LPDDR4 standard, the variation (i.e., drop voltage ΔVd) for the second power supply voltage VDD2, and the resulting effect on the data strobe signal DQS may be defined as a DQ to DQS offset variation parameter "tDQS2DQ_volt". The specific level ΔVd may be selected with reference to the parameter "tDQS2DQ_volt".

Here, it is assumed that the second power supply voltage VDD2 varies (e.g., drops) in its level from the normal level V1 by the voltage drop ΔVd at a time Ts. In this case, due to the influence of a voltage drop ΔVd, the clock signal CK that is delayed as much as "DQS_DL", as compared with the normal case shown in FIG. 5A, may be generated by the clock path 1240. As a result, at each of times t1 to t5 a data signal DQ is latched outside the centers of the data D0 to D5. This latch condition may greatly reduce overall data integrity.

The training method of the inventive concept is provided to compensate for the delay of the data strobe signal DQS due to the fluctuations of the second power supply voltage VDD2. That is, the DQS delay DQS_DL may be detected by applying the second power supply voltage VDD2, the level of which is dropped as much as the specific level ΔVd in the write training. The timing of the data signal DQ may be adjusted in consideration of the detected DQS delay DQS_DL.

Figure 6:
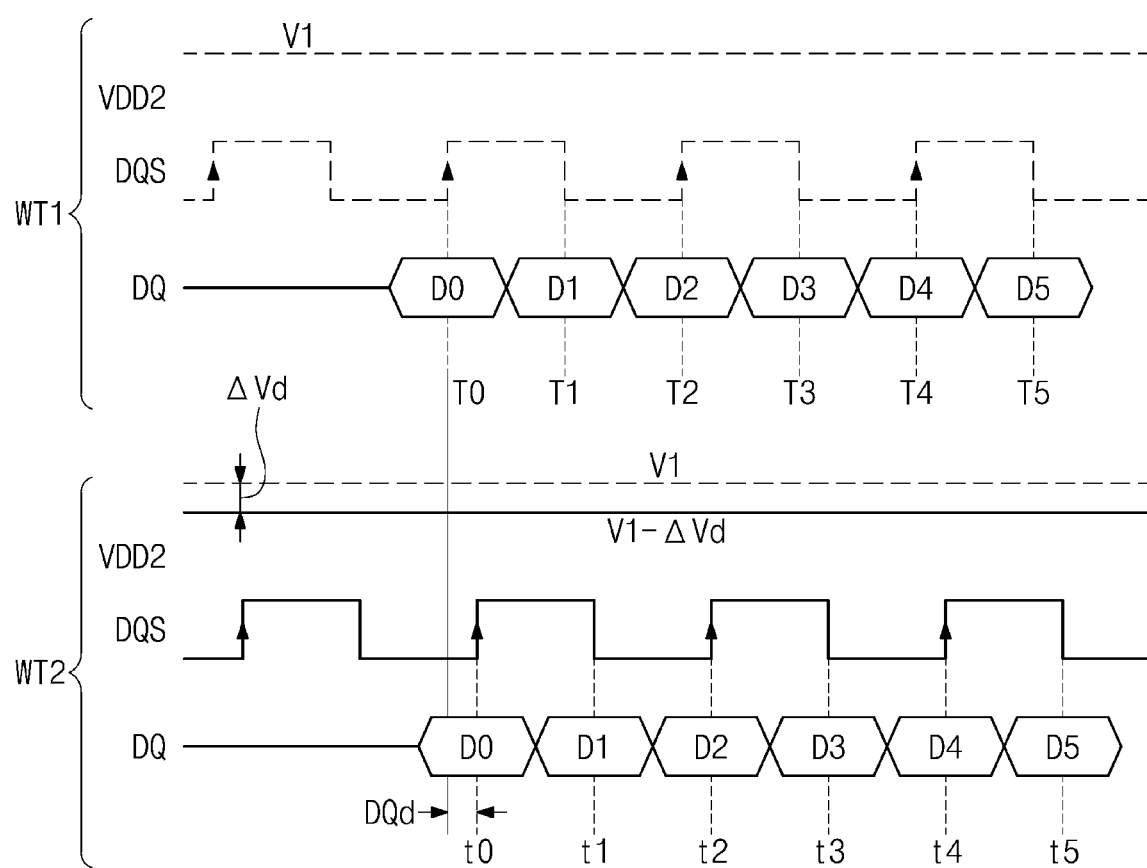
FIG. 6 is a timing diagram illustrating a write training method according to embodiments of the inventive concept.

FIG. 6 is a timing diagram illustrating a write training method according to embodiments of the inventive concept. Referring to FIG. 6, the write training method includes the first training mode WT1 and the second training mode WT2. In the first training mode WT1, the center of the data signal DQ may be detected under the condition that the normal second power supply voltage (VDD2) is applied. In the second training mode WT2, the center of the data signal DQ may be detected under the condition that the dropped second power supply voltage (VDD2−ΔVd) is applied.

Accordingly, in the first training mode WT1, the SoC 1100 may set the PMIC 1300 to generate the normal second power supply voltage having the level normal level V1 (e.g., 1.1 V) as defined in the specification of the DRAM 1200. The PMIC 1300 may then generate the normal second power supply voltage VDD2 and provide same to the DRAM 1200. The SoC 1100 may then execute the first training mode WT1 under the condition that the normal second power supply voltage VDD2 is applied.

Thus, the write training method according to embodiments of the inventive concept in the first training mode WT1 provides the normal second power supply voltage VDD2, and the SoC 1100 repeatedly write data to and/or reads data from the DRAM 1200 using the data strobe signal DQS and the data signal(s) DQ. That is, write operations and/or read operations may be repeated to find appropriate data signal(s) DQ timing, at which each respective data signal(s) DQ is optimally matched to the data strobe signal DQS.

In this regard, the SoC 1100 may first transfer the data strobe signal DQS and the data signal DQ corresponding to a first step Step_1 to the DRAM 1200. In the first step Step_1, the data signal DQ that is delayed with respect to the data strobe signal DQS as much as a first delay value of the delay locked loop DLL is provided. Next, the SoC 1100 may calculate a data error rate for data written to the DRAM 1200. Then, the SoC 1100 may transfer the data signal DQ corresponding to a second step Step_2 to the DRAM 1200 and may read data from the DRAM 1200. The data signal DQ in the second step Step_2 is delayed with respect to the data signal DQ in the first step Step_1 by as much as a specific delay time. Multiple training steps may be performed in the above manner, and a center value for the respective data signal(s) DQ corresponding to a position where a least data error rate is determined.

As the first training mode WT1 is executed, each data signal DQ may be selected such that a rising edge and/or a falling edge of the data strobe signal DQS occurs at the center of a data window. Each of data signals DQx illustrated shows how a timing is adjusted through the execution of the first training mode WT1.

The second training mode WT2 may be executed to detect the center of the data signal DQ when the dropped second power supply voltage (VDD2−ΔVd) is applied. In the second training mode WT2, the SoC 1100 may set the PMIC 1300 to generate the second power supply voltage VDD2 at (e.g.) a reduced level (e.g., V1−ΔVd=1.05 V) that is less than the normal level V1, as defined by the specifications of the DRAM 1200. The PMIC 1300 may generate the dropped second power supply voltage and provide the dropped second power supply voltage to the DRAM 1200. The SoC 1100 may then execute the second training mode WT2 under the condition that the dropped second power supply voltage is applied.

In the write training according to embodiments of the inventive concept, the second training mode WT2 may apply the dropped second power supply voltage and the SoC 1100 may repeatedly write data to and/or read data from the DRAM 1200 using the strobe signal DQS and the data signal(s) DQ. That is, write and read operations corresponding to multiple steps may be repeated to find a respective timing position for the respective the data signal(s) DQ at which the data signal DQ is optimally matched with the data strobe signal DQS.

First, the SoC 1100 may transfer the data strobe signal DQS and the data signal DQ corresponding to the first step Step_1 to the DRAM 1200. In the first step Step_1, the data signal DQ that is delayed with respect to the data strobe signal DQS as much as the first delay value of the delay locked loop DLL is provided. Next, the SoC 1100 may calculate an error rate of data written in the DRAM 1200. Then, the SoC 1100 may transfer the data signal DQ corresponding to a second step Step_2 to the DRAM 1200 and may read data from the DRAM 1200. The data signal DQ in the second step Step_2 is delayed with respect to the data signal DQ in the first step Step_1 as much as a specific time. Multiple training steps may be performed in this manner, and a center value for each respective data signal DQ corresponding to a position of least data error rate may be determined.

As the second training mode WT2 is executed, the data signal DQ may be selected such that each of a rising edge and a falling edge of the data strobe signal DQS corresponding to a delayed time DQd is placed at the center of a data window. Each of data signals DQx illustrated shows how a timing is adjusted through the execution of the second training mode WT2.

Through the write training performed in the first training mode WT1 and the second training mode WT2, the SoC 1100 may detect a delay DQd of the data strobe signal DQS according to a level change of the second power supply voltage VDD2. The reliability of a data signal may be improved by applying the detected delay DQd of the data strobe signal DQS to the timing of the data signal DQ.

Figure 7:
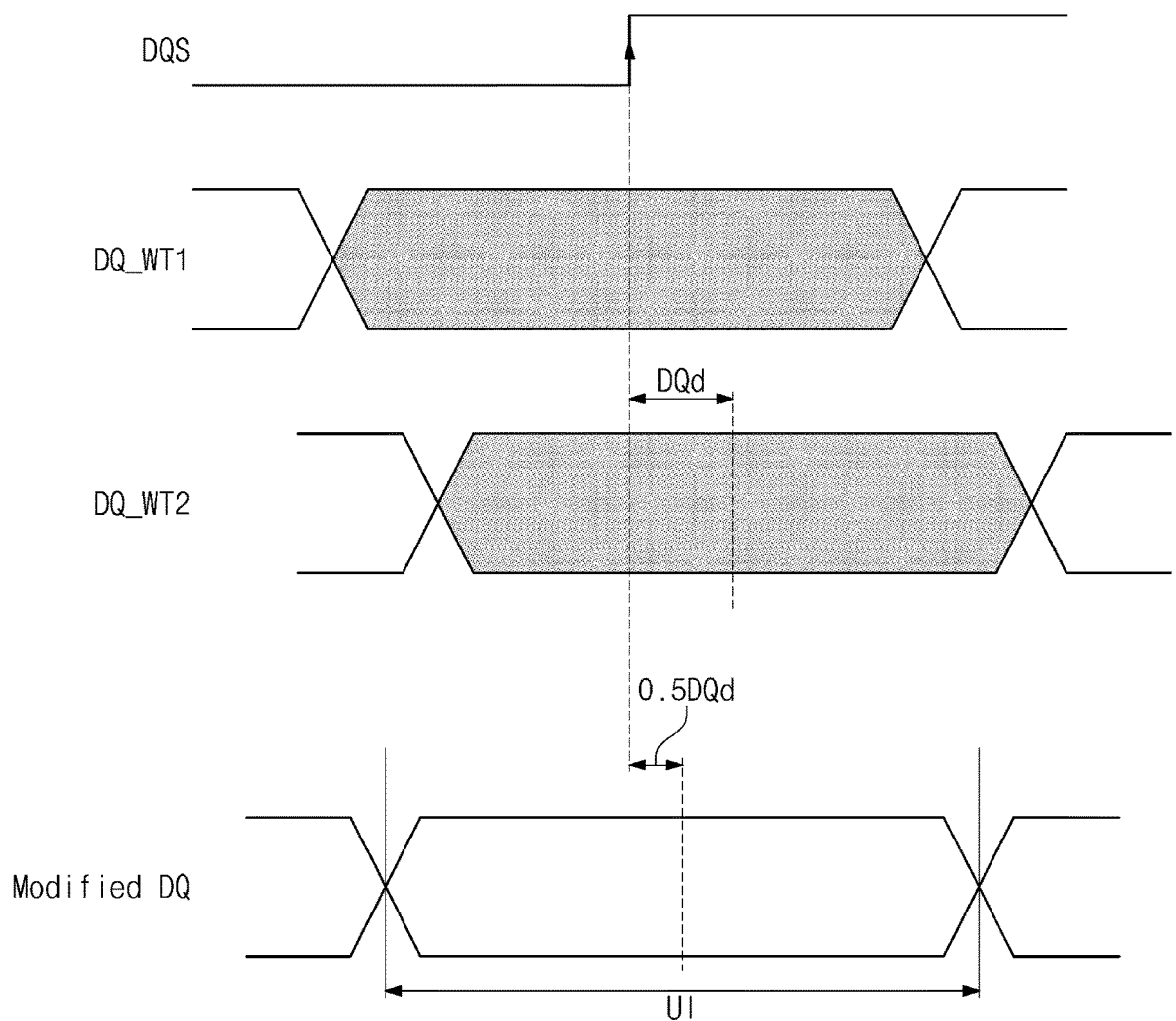
FIG. 7 is a timing diagram illustrating a method of adjusting a delay of a data signal using the write training method according to embodiments of the inventive concept.

FIG. 7 is a timing diagram further illustrating a method of adjusting a delay in the data signal DQ by using a write training method according to embodiments of the inventive concept. Referring to FIG. 7, it is possible to adjust a final setup margin of a data signal by using the delay DQd of the data signal DQ obtained through the write training method.

Here, for convenience of description, it is assumed that a time point at which the data strobe signal DQS provided from the SoC 1100 has a low-to-high transition is fixed. Actually, a rising edge or a falling edge of the data strobe signal DQS that is provided from the SoC 1100 occurs at regular intervals. However, the delay DQd of the data strobe signal DQS due to a level change of the second power supply voltage VDD2 may actually occur at the clock path 1240 (refer to FIG. 3) that is placed within the DRAM 1200. Accordingly, a value that is adjusted by the SoC 1100 for the compensation of the delay DQd of the data strobe signal DQS is a magnitude of a delay in the data signal DQ.

Through execution of the first training mode WT1 of the write training method, the SoC 1100 may obtain the same timing condition as the data signal DQ_WT1. The data signal DQ_WT1 corresponds to a timing value having a highest data reliability with regard to the data strobe signal DQS under the condition that the normal second power supply voltage VDD2 is applied.

Through execution of the second training mode WT2 of the write training method, the SoC 1100 may obtain the same timing condition as the data signal DQ_WT2. The data signal DQ_WT2 corresponds to a timing value having the highest data reliability under the condition that the dropped second power supply voltage is applied. That is, a delay of the clock signal CK that is generated within the DRAM 1200 by using the data strobe signal DQS occurs in response to the dropped second power supply voltage. Accordingly, as the clock signal CK is delayed, the data signal DQ_WT2 has to be delayed with respect to the data signal DQ_WT1 as much as the data signal delay DQd. The magnitude of the delay DQd of a data signal due to variation in the level of the second power supply voltage may be detected through the execution of the second training mode WT2.

Through execution of the first training mode WT1 and the second training mode WT2, the SoC 1100 may calculate the delay DQd of the data signal due to variation in the level of the second power supply voltage. For example, the data signal delay DQd may be calculated in such a way to decrease the magnitude of a delay step for each of the data signal(s) DQ_WT2 and the data signal(s) DQ_WT1 detected during training. That is, the data signal delay DQd may be calculated as a difference value between delay steps of the delay locked loop DLL for setting delays of the data signal DQ_WT2 and the data signal DQ_WT1.

When the data signal delay DQd is calculated, the SoC 1100 may adjust the magnitude of a final setup margin for each data signal using the data signal delay DQd. For example, the SoC 1100 may decrease a setup margin of the data signal DQ as much as a magnitude corresponding to half the data signal delay DQd (i.e., 0.5 DQd). However, the above adjustment of the setup margin is only an illustrative example, and adjustment(s) of the setup margin may be determined in consideration of overall operation conditions of the DRAM 1200 in view of various operating specifications.

Methods of calculating the data signal delay DQd through write training according to embodiments of the inventive concept may include application of variation in the level of the second power supply voltage. Here, the data signal delay DQd may be understood as a parameter in which a delay has been caused due to a delay of the data strobe signal DQS occurring under respective normal level and dropped level conditions. When the data signal delay DQd is detected, it is possible to finally adjust the setup margin of the data signal DQ. As the setup margin is adjusted, the data signal DQ may compensate for the delay of the data strobe signal DQS, which may occur as the second power supply voltage VDD2 varies in level.

Figure 8:
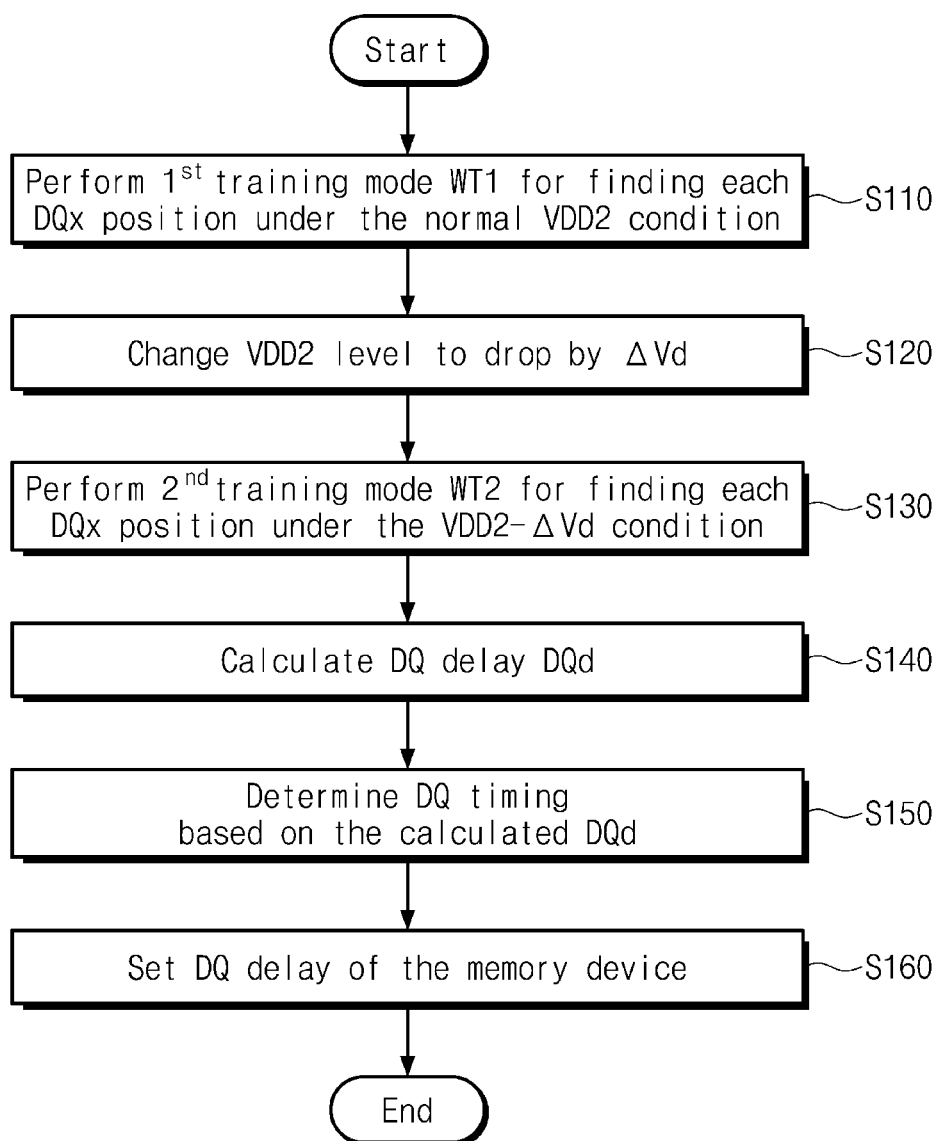
FIG. 8 is a flowchart summarizing in one example a write training method according to embodiments of the inventive concept.

FIG. 8 is a flowchart summarizing in one example a write training method according to embodiments of the inventive concept. Referring to FIGS. 1 and 8, the SoC 1100 may control the execution of a write training operation to detect a delay of the data strobe signal DQS which may occur as the second power supply voltage VDD2 varies in level. The SoC 1100 may adjust the delay in the data signal DQ by compensating for a delay in the data strobe signal DQS with reference to the magnitude of a detected delay.

In the write training method of FIG. 8, a first training mode WT1 is performed (S110). Using the normal second power supply voltage VDD2, the SoC 1100 may cause the repeated execution of write and/or read operations by the DRAM 1200 using the data strobe signal DQS and the data signal(s) DQ to which a delay is applied. That is, write and/or read operations including multiple steps may be repeated performed to find a position of the respective data signal(s) DQ, such that each data signal DQ is optimally matched in timing with the data strobe signal DQS. The multiple training steps may be performed in this manner, until a position of a data signal DQx corresponding to a position at which a least data error rate is determined.

Next, the SoC 1100 controls the PMIC 1300 to adjust (e.g., drop) the level of the second power supply voltage VDD2 (S120). That is, the SoC 1100 may cause the PMIC 1300 to generate the dropped second power supply voltage VDD2−ΔVd. In this case, the PMIC 1300 may be set such that levels of the remaining power supply voltages (e.g., VDDQ and VDD1) supplied to the DRAM 1200 are not adjusted.

Then, the second training mode WT2 of the write training operation may be performed (S130). While the dropped second power supply voltage VDD2−ΔVd is applied, the SoC 1100 may cause write and/or read operations to be performed by the DRAM 1200 using the data strobe signal DQS and the data signal(s) DQ to which a delay is applied. That is, write and/or read operations including multiple steps may be repeated to find a position for each of the data signal(s) DQ at which the data signal DQ is optimally matched in timing with the data strobe signal DQS. The multiple training steps may be performed in the above manner, and a position for each of the data signal(s) DQx corresponding to a least data error rate may be determined.

The SoC 1100 may now calculate a data signal delay DQd using the positions of the data signal DQx respectively determined above (e.g., S110, S120 and S130) (S140). Here, the data signal delay DQd is, substantially, a value that is detected to quantitatively measure the delay DQS_DL of the data strobe signal DQS due to variation in the level of the second power supply voltage VDD2. The magnitude of a delay step for each of the data signal DQ_WT2 and the data signal DQ_WT1 detected through the training operation may be subtracted to calculate the data signal delay DQd.

Next, the SoC 1100 may adjust the magnitude of a setup margin of the final data signal DQ using the calculated data signal delay DQd (S150). For example, the SoC 1100 may decrease a setup margin of the data signal DQ by as much as the magnitude corresponding to half of the data signal delay DQd (i.e., 0.5 DQd). Alternatively, the SoC 1100 may adjust the setup margin of the data signal DQ in consideration of an eye pattern of the data signal DQ and the data signal delay DQd. Alternately or additionally, the setup margin of the data signal DQ may be adjusted (or further adjusted) in consideration of the overall operating conditions of the DRAM 1200 (e.g., temperature, operating frequency, etc.).

Then, the SoC 1100 may set a delay of the data signal DQ depending on the determined setup margin of the data signal DQ or a hold margin thereof (S160). For example, the SoC 1100 may set the delay locked loop DLL of the DRAM controller 1120 (refer to FIG. 2) included therein so as to have a setup margin or a hold margin of a data signal.

According to the above training method, a volatile memory (e.g., the DRAM 1200) according to embodiments of the inventive concept may compensate for the delay DQS_DL of the data strobe signal DQS due to variation in the level of the second power supply voltage VDD2. As the delay DQS_DL of the data strobe signal DQS is compensated for based on values actually measured from the DRAM 1200, data reliability may be improved. In addition, deviations of the data strobe signal DQS due to process variation(s) in the fabrication of the DRAM 1200 may be compensated for based on actual, measured values.

Figure 9:
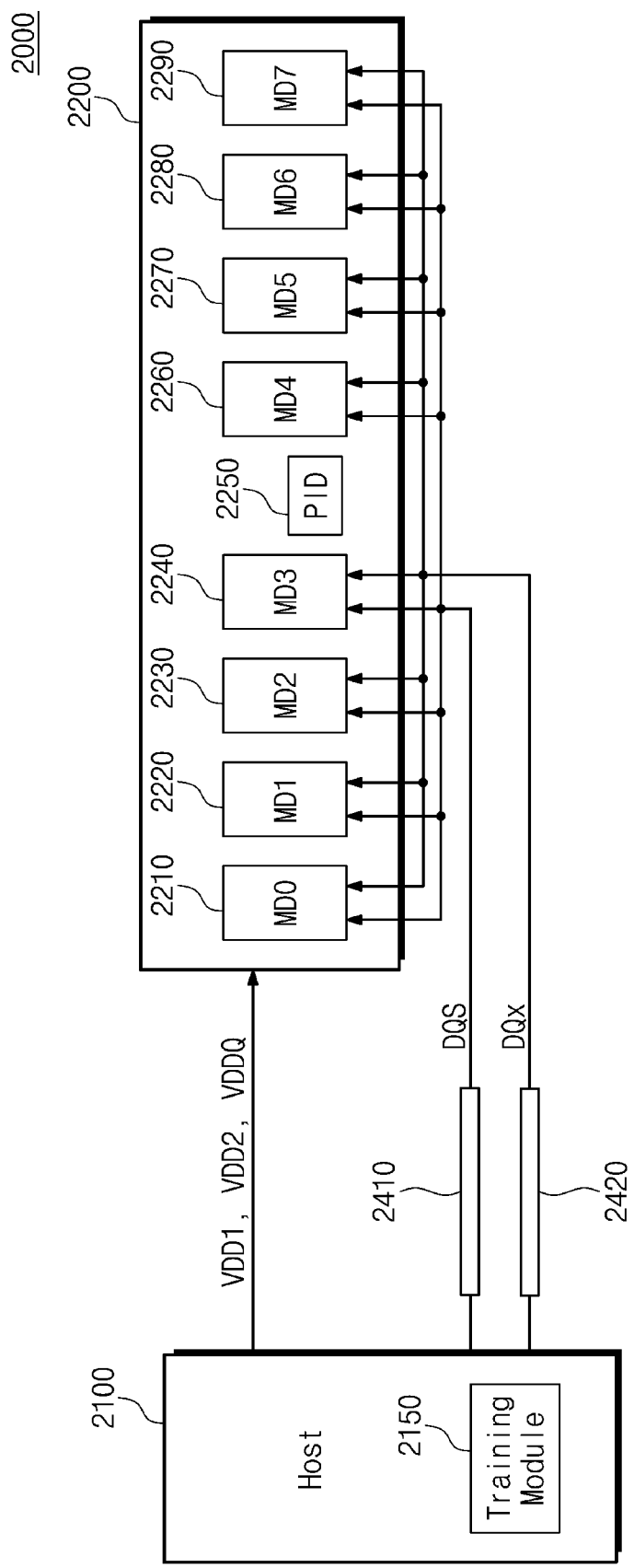
FIGS. 9 and 10 are respective block diagrams illustrating various memory systems according to embodiments of the inventive concept.

FIG. 9 is a block diagram illustrating a memory system according to another embodiment of the inventive concept. Referring to FIG. 9, a memory system 2000 may include a host 2100 and a memory module 2200. A data strobe signal (DQS) line 2410 and a data signal (DQ) line 2420 for data exchange are provided between the host 2100 and the memory module 2200 are provided.

The host 2100 may provide the memory module 2200 with a control signal, a command, an address, a data signal DQx, the data strobe signal DQS, etc. In addition, the host 2100 may provide the power supply voltages VDD1, VDD2, and VDDQ for driving the memory module 2200. The host 2100 may perform the write training to detect a delay of the data strobe signal DQS due to variation in the level of the second power supply voltage VDD2. The SoC 1100 may adjust a delay of the data signal DQ for compensating influence of the delay of the data strobe signal DQS with reference to a magnitude of the detected delay. The host 2100 may include a training module 2150 associated with the write training operation.

The training module 2150 may perform write data training (or "DQ training") for the memory module 2200 in one of a number of specific situation(s) for the memory system 2000, such as booting or initialization. The training module 2150 may improve the reliability of data exchange with the memory module 2200 using the write training. For example, the training module 2150 may repeatedly write a training pattern to and/or read a training pattern from the memory module 2200 under various conditions to detect the center of an eye pattern of the data signal DQ. To align the detected window center of the data signal DQ, the training module 2150 may adjust an offset value of the delay locked loop DLL or the phase locked loop PLL.

In the write training operation, the training module 2150 of the inventive concept may perform the write training for compensating for a delay of the data strobe signal DQS, which occurs as a level of a power supply voltage VDD2 varies. To this end, in the write training, the training module 2150 may detect a delay value of the data strobe signal DQS, which occurs when the level of the power supply voltage VDD2 is lower than the normal level. A delay offset of the data signal DQ may be adjusted in consideration of the detected delay value.

The memory module 2200 may include a plurality of memory devices 2210 to 2240 and 2260 to 2290 and a serial component recognition device (hereinafter referred to as "SPD") 2250 storing product information of the memory module 2200. The plurality of memory devices 2210 to 2240 and 2260 to 2290 may store data in response to command(s) CMD, address(es) ADD, and the data strobe signal DQS provided from the host 2100, or may output data stored therein in response to command(s) CMD, address(es) ADD, and the data strobe signal DQS. When the write training operation is performed by the host 2100, the second power supply voltage VDD2 that is provided to the plurality of memory devices 2210 to 2240 and 2260 to 2290 may vary depending on a mode.

The SPD 2250 stores SPD information provided from the host 2100. In general, the SPD information includes, but is not limited to, a size, a capacity, a driving speed, a driving voltage, chip layout information, and a module ID of the memory module 2200a.

According to the memory system 2000 of the above configuration, the memory module 2200 may compensate for the delay DQS_DL of the data strobe signal DQS due to the fluctuations of the second power supply voltage VDD2. As the delay DQS_DL of the data strobe signal DQS is compensated for based on values actually measured from the memory module 2200, high reliability may be secured.

Figure 10:
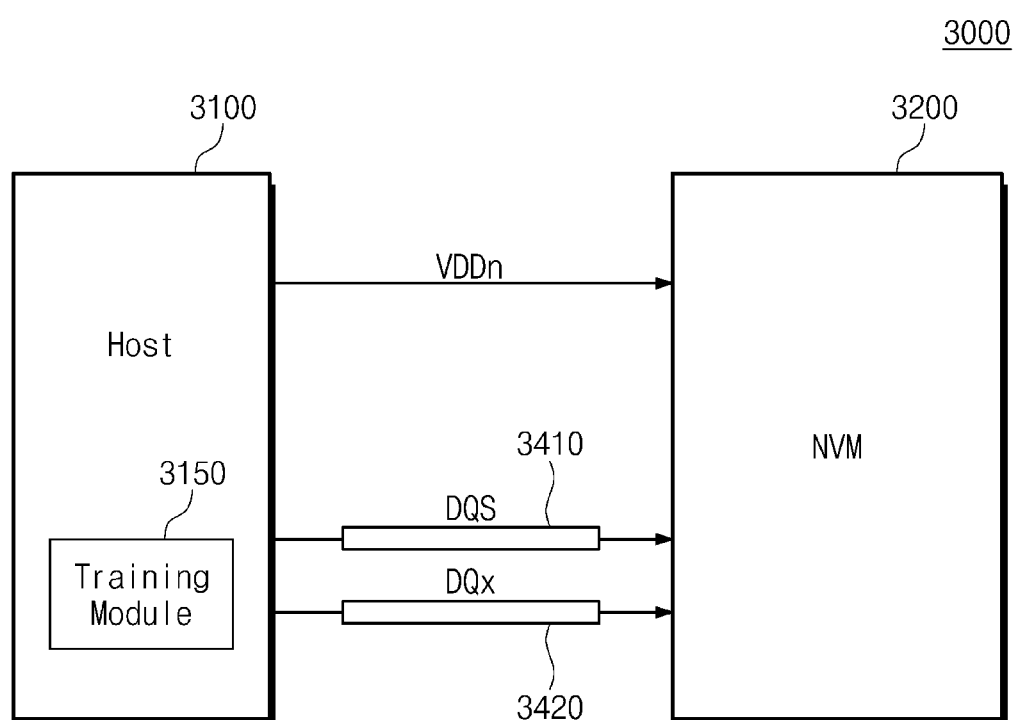

FIG. 10 is a block diagram illustrating a memory system according to another embodiment of the inventive concept. Referring to FIG. 10, a memory system 3000 may include a host 3100 and a nonvolatile memory 3200. A data strobe signal (DQS) line 3410 and a data signal (DQ) line 3420 for data exchange are provided between the host 3100 and the nonvolatile memory 3200 are provided.

The host 3100 may provide the nonvolatile memory 3200 with control signal(s), command(s), address(es), the data signal DQx, the data strobe signal DQS, etc. In addition, the host 3100 may provide a power supply voltage VDDn for driving the nonvolatile memory 3200. Here, the power supply voltage VDDn may be a power supply voltage capable of causing a delay of the data strobe signal DQS when a level of the power supply voltage VDDn is changed.

The host 3100 may perform the write training on the nonvolatile memory 3200 to detect a delay of the data strobe signal DQS due to variation in the level of the power supply voltage VDDn. The host 3100 may then adjust a delay of the data signal DQx to compensate for the delay of the data strobe signal DQS with reference to the magnitude of the detected delay. The host 3100 may include a training module 3150 controlling execution of the write training operation.

The training module 3150 may perform data training (or "DQ training") of the nonvolatile memory 3200 in one of a number of specific situations for the memory system 3000, such as booting or initialization. The training module 3150 may improve the reliability of data exchange with the nonvolatile memory 3200 using write training. For example, the training module 3150 may repeatedly write a training pattern to and/or read a training pattern from the nonvolatile memory 3200 under various conditions to detect the center of an eye pattern of the data signal DQ. To align the detected window center of the data signal DQ, the training module 3150 may adjust an offset value of the delay locked loop DLL or the phase locked loop PLL. The write training that the training module 3150 performs on the nonvolatile memory 3200 is substantially identical in manner to the write training described with reference to FIGS. 1 to 9.

The nonvolatile memory 3200 may exchange data with the host 3100 by using the data signal DQ and the data strobe signal DQS. The nonvolatile memory 3200 may be implemented with a single memory device chip, or a package or storage device including a plurality of memory devices.

Figure 11:
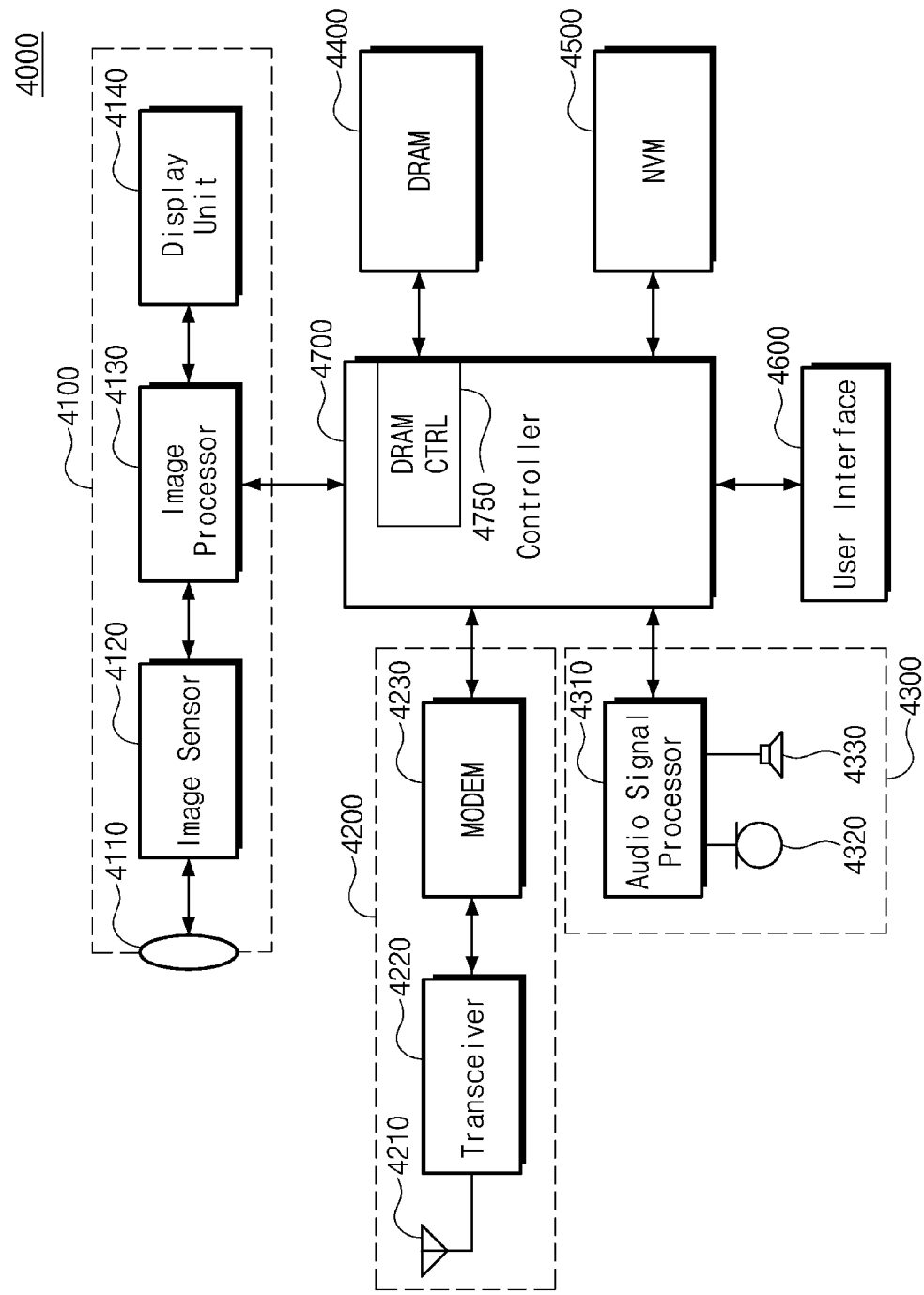
FIG. 11 is a block diagram illustrating a portable terminal according to embodiments of the inventive concept.

FIG. 11 is a block diagram illustrating a portable terminal according to embodiments of the inventive concept. Referring to FIG. 11, a portable terminal 4000 according to an embodiment of the inventive concept includes an image processing unit 4100, a wireless transceiver unit 4200, an audio processing unit 4300, a DRAM 4400, a nonvolatile memory device 4500, a user interface 4600, and a controller 4700.

The image processing unit 4100 may include a lens 4110, an image sensor 4120, an image processor 4130, and a display unit 4140. The wireless transceiver unit 4210 includes an antenna 4210, a transceiver 4220, and a modulator/demodulator (modem) 4230. The audio processing unit 4300 includes an audio processor 4310, a microphone 4320, and a speaker 4330.

Here, the controller 4700 may include the same components as the SoC 1100 of FIG. 2. The controller 4700 may include a DRAM controller 4750 for data exchange with the DRAM 4400. The DRAM controller 4750 may communicate with the DRAM 4400 by using the data signal DQ and the data strobe signal DQS. The controller 4700 may detect a delay of the data strobe signal DQS due to a level change of a power supply voltage using a write training method consistent with embodiments of the inventive concept. The controller 4700 may adjust a delay of the data signal DQ for compensating for the delay of the data strobe signal DQS due to the fluctuations of the power supply voltage.

According to embodiments of the inventive concept, a delay of a data signal may be adjusted based on a result of actually measuring a delay of a data strobe signal due to a change in a power supply voltage of a memory device. Accordingly, an optimal delay value of a data signal associated with an individual memory device may be set. As a result, it is possible to implement an electronic device having the improved data integrity.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. An electronic device comprising:
   a system-on-chip (SoC) that generates a data strobe signal and a data signal; and
   a memory device that receives a power supply voltage and exchanges data with the SoC in response to the data strobe signal and the data signal,
   wherein the SoC performs write training that measures a magnitude of a delay of the data strobe signal due to variation in a level of the power supply voltage, and that adjusts a delay of the data signal using a result of the write training.

2. The electronic device of claim 1, wherein the write training includes:
   a first training mode that aligns the data strobe signal and the data signal while the power supply voltage is a normal power supply voltage applied to the memory device; and
   a second training mode that aligns the data strobe signal and the data signal while the power supply voltage is a dropped power supply voltage applied to the memory device.

3. The electronic device of claim 2, wherein the SoC obtains a difference between a first delay value of the data signal provided as a result of the first training mode, and a second delay value of the data signal provided as a result of the second training mode to detect delay of the data strobe signal due to variation in the level of the power supply voltage.

4. The electronic device of claim 3, wherein the SoC adjusts a setup margin of the data signal using the delay of the data strobe signal.

5. The electronic device of claim 2, wherein the power supply voltage is a "VDD2" voltage defined in a low power double data rate (LPDDR) standard.

6. The electronic device of claim 5, wherein a voltage difference between the normal power supply voltage and the dropped power supply voltage corresponds to "tDQS2DQ_volt" of the LPDDR standard.

7. The electronic device of claim 1, further comprising:
a power management integrated circuit (PMIC) that varies the level of the power supply voltage under control of the SoC.

8. The electronic device of claim 1, wherein the SoC includes:
a training module storing code that when executed performs the write training during a booting operation.

9. A training method for an electronic device including a system-on-chip (SoC) and a memory device, the method comprising:
providing a data signal and a data strobe signal from the SoC to the memory device;
setting a level of a power supply voltage provided to the memory device to a normal level to generate a normal power supply voltage;
performing a first training mode to align the data signal with the data strobe signal under a condition that the normal power supply voltage is applied to the memory device;
setting the level of the power supply voltage to a dropped level lower than the normal level to generate a dropped power supply voltage;
performing a second training mode to align the data signal and the data strobe signal under a condition that the dropped power supply voltage is applied to the memory device; and
calculating a delay for the data strobe signal due to variation in the level of the power supply voltage using a result of the first training mode and a result of the second training mode.

10. The method of claim 9, wherein the power supply voltage is a "VDD2" voltage defined in a low power double data rate (LPDDR) standard.

11. The method of claim 10, wherein a voltage difference between the normal power supply voltage and the dropped power supply voltage corresponds to "tDQS2DQ_volt" of the LPDDR standard.

12. The method of claim 9, wherein the calculating of the delay for the data strobe signal includes:
calculating a difference between a first delay value for the data signal determined during the first training mode and a second delay value for the data signal determined during the second training mode; and
defining the delay for the data strobe signal as the calculated difference.

13. The method of claim 9, further comprising:
decreasing a setup margin for the data signal by a given step with reference to the delay for the data strobe signal.

14. The method of claim 13, wherein the given step is smaller than the delay of the data strobe signal.

15. An electronic device comprising:
a memory device driven in response to a power supply voltage;
a host configured to transfer a data signal and a data strobe signal to the memory device; and
a power management integrated circuit (PMIC) configured to provide the power supply voltage to the memory device under control of the host,
wherein the host performs software training that measures a delay of the data strobe signal due to variation in the level of the power supply voltage within the memory device.

16. The electronic device of claim 15, wherein the memory device includes a storage medium configured to store data, and a peripheral circuit configured to control the storage medium, and
the power supply voltage drives the peripheral circuit.

17. The electronic device of claim 15, wherein the host performs write training that aligns the data signal and the data strobe signal under a first condition that the power supply voltage is a normal power supply voltage, and under a second condition that the power supply voltage is a dropped power supply voltage in order to measure a delay for the data strobe signal.

18. The electronic device of claim 17, wherein the host calculates a delay difference for an eye shape of the data signal obtained by performing the write training, and allocates the calculated delay difference as the delay for the data strobe signal.

19. The electronic device of claim 18, wherein the host adjusts a setup margin of the data signal using the delay for the data strobe signal.

20. The electronic device of claim 15, wherein the memory device is a Dynamic Random Access Memory (DRAM) operating in accordance with a low power double data rate (LPDDR) standard.

* * * * *